United States Patent [19]
Mimoto

[11] Patent Number: 5,442,217
[45] Date of Patent: Aug. 15, 1995

[54] SEMICONDUCTOR APPARATUS INCLUDING A PROTECTION CIRCUIT AGAINST ELECTROSTATIC DISCHARGE

[75] Inventor: Toshio Mimoto, Nara, Japan

[73] Assignee: Sharp Kabushiki Kaisha, Osaka, Japan

[21] Appl. No.: 157,483

[22] Filed: Nov. 26, 1993

[30] Foreign Application Priority Data

Dec. 1, 1992 [JP] Japan ................... 4-322114

[51] Int. Cl.$^6$ ................... H01L 29/06; H01L 29/78
[52] U.S. Cl. ................... 257/361; 257/362; 257/355; 257/546; 361/111
[58] Field of Search ............ 257/360, 361, 362, 363, 257/546; 361/90, 91, 92, 111

[56] References Cited

U.S. PATENT DOCUMENTS

| | | | |
|---|---|---|---|
| 4,692,781 | 9/1987 | Rountree et al. | 257/360 |
| 5,001,529 | 3/1991 | Ohshima et al. | 257/362 |
| 5,034,845 | 7/1991 | Murakami | 361/56 |
| 5,158,899 | 10/1992 | Yamagata | 257/361 |

FOREIGN PATENT DOCUMENTS

| | | |
|---|---|---|
| 59-51558 | 3/1984 | Japan . |
| 60-235451 | 11/1985 | Japan . |
| 60-235452 | 11/1985 | Japan . |
| 2-5478 | 1/1990 | Japan . |
| 2-39570 | 2/1990 | Japan . |

OTHER PUBLICATIONS

T. V. Hulett, 'EOS/ESD Symposium, 1981, pp. 90–96, "On Chip Protection of High Density NMOS Devices".

Primary Examiner—Jerome Jackson
Assistant Examiner—John Guay
Attorney, Agent, or Firm—Nixon & Vanderhye

[57] ABSTRACT

A semiconductor apparatus includes multiple protection devices to protect against electrostatic discharge to an internal circuit contained in the semiconductor apparatus. The semiconductor apparatus includes plural terminals including a ground terminal, a substrate bias terminal, a power supply terminal, and an input/output signal terminal. Plural protection devices are connected between various ones of these terminals to provide the necessary discharge protection for a variety of discharge scenarios.

3 Claims, 18 Drawing Sheets

PROTECTION CIRCUIT

PROTECTION CIRCUIT

PROTECTION CIRCUIT

PROTECTION CIRCUIT

SEMICONDUCTOR APPARATUS INCLUDING A PROTECTION CIRCUIT AGAINST ELECTROSTATIC DISCHARGE

BACKGROUND OF THE INVENTION

1. Field of the Invention

The present invention relates to a semiconductor apparatus, and in particular to a semiconductor apparatus including a protection circuit for protecting the semiconductor device against electrostatic discharge.

2. Description of the Related Art

FIG. 19 is a circuit diagram for a general monolithic semiconductor integrated circuit 50 in which the potential of a substrate power supply is set to be equal to the potential of a ground power supply. The monolithic semiconductor integrated circuit 50 includes a protection circuit 60 for protecting the integrated circuit 50. Hereinafter, such a protection circuit for protecting the semiconductor device such as the integrated circuit 50 against electrostatic discharge will simply be referred to as the "protection circuit". The protection circuit 60, which is described in Terry V. Hulett, "On Chip Protection of High Density NMOS Devices" published in EOS/ESD Symposium, 1981, has been widely used as a typical protection device against electrostatic discharge used in a MOS device until the present time.

The protection circuit 60 includes a resistance 13 between an input terminal 11 and an internal circuit 12. Point A between the resistance 13 and the internal circuit 12 is connected to the ground power supply through a MOS transistor 14. The resistance 13 is provided for restricting the amount of an electrostatic current. The MOS transistor 14 is an enhancement n-channel transistor for sending the electrostatic current to the ground power supply, and has a drain connected to point A and a source and a gate both connected to the ground power supply.

When a high electrostatic voltage is applied to the input terminal 11, the high voltage is applied to the MOS transistor 14 through the resistance 13. When being supplied with a high voltage, the MOS transistor 14 acts as a bipolar transistor, and is conductive with a low resistance due to a punch-through phenomenon. As a result, the electrostatic current flows to the ground power supply through the resistance 13 and the MOS transistor 14, thereby preventing a high voltage from being stored at point A. Thus, breakdown of the internal circuit 12 by electrostatic discharge is prevented.

FIG. 20 is a cross sectional view of the protection circuit 60 formed in a p-type semiconductor substrate 15. The p-type semiconductor substrate 15 is connected to the ground power supply through a p-type diffusion layer 16 and a wiring 17. The resistance 13 includes an n-type diffusion layer 18 formed in the p-type semiconductor substrate 15. The n-type diffusion layer 18 is connected to the input terminal 11 through a wiring 19 at one end thereof and to the wiring 20 at the other end thereof. Point A, which is connected to the wiring 20, is connected to the internal circuit 12 (not shown). The MOS transistor 14 includes n-type diffusion layers 21 and 22 formed in the p-type semiconductor substrate 15 and a gate electrode 23 provided above a region between the n-type diffusion layers 21 and 22. The n-type diffusion layer 21 is connected to the wiring 20, and the n-type diffusion layer 22 is connected to the ground power supply through the wiring 17. The gate electrode 23 is also connected to the ground power supply. The wirings 17, 19 and 20 are formed on the p-type semiconductor substrate 15 over the an insulating layer film 33.

When a high electrostatic voltage is applied to the MOS transistor 14 from the input terminal 11 through the resistance 13, the MOS transistor 14 acts as an npn transistor 24 shown in FIG. 20. The n-type diffusion layers 21 and 22, which respectively act as a collector and an emitter of the npn transistor 24, are conductive to each other with a low resistance due to a punch-through phenomenon. Accordingly, the electrostatic current flows from the input terminal 11 to the ground power supply through the wiring 19, the n-type diffusion layer 18 (namely, the resistance 13), the wiring 20, the n-type diffusion layers 21 and 22, and the wiring 17.

The n-type diffusion layers 21 and 22 are electrically connected with each other when the level of the applied electrostatic voltage exceeds the breakdown voltage of the MOS transistor 14. Usually, the breakdown voltage is lower than a breakdown voltage of a parasitic diode 25 formed by the pn junction of the p-type semiconductor substrate 15 and the n-type diffusion layer 18. Therefore, the electrostatic current in the MOS transistor 14 flows out to the ground power supply due to a punch-through phenomenon before the parasitic diode 25 breaks down. When an excessively high electrostatic voltage is applied, the voltage drop in the resistance 13 is increased. Accordingly, the level of the voltage applied to a connection area between the n-type diffusion layer 18 and the wiring 19 possible exceeds the breakdown voltage of the parasitic diode 25. In such a case, the electrostatic current flows in a reverse direction in the parasitic diode 25 to the p-type semiconductor substrate 15 and further to the ground power supply through a p-type diffusion layer 16. Since the power dissipation caused by the electrostatic current is mostly generated in the parasitic diode 25, namely, the junction interface of the n-type diffusion layer 18 and the semiconductor substrate 15 is broken. In "One Chip Protection of High Density MOS Devices", it is proposed to form the resistance 13 of polysilicon in order to prevent such a breakdown of the interface. In Japanese Laid-Open Patent Publication No. 2-5478, it is proposed to provide another diffusion layer having an identical conductivity with and having a lower density than those of the n-type diffusion layer 18 in a region below the connection area of the n-type diffusion layer 18 and the wiring 19, in order to raise the breakdown voltage of the parasitic diode 25. The resistance 13 for restricting the amount of the electrostatic current may be eliminated by increasing the current capacitance of the npn transistor 24 to a sufficient level.

In the MOS transistor 14, which functions as the npn transistor 24 for utilizing the punch-through phenomenon, the gate electrode 23 does not have any important function. Accordingly, the MOS transistor 14 may be replaced by an npn transistor 26 shown in FIGS. 21 and 22. FIG. 21 is a plan view and FIG. 22 is a cross sectional view of the npn transistor 26. The npn transistor 26 includes n-type diffusion layers 21 and 22 formed in the semiconductor substrate 15 and an isolation layer 27 formed of $SiO_2$ between the n-type diffusion layers 21 and 22. Such an npn transistor is described in the U.S. Pat. No. 4,692,781. Similar structures and concepts are described in Japanese Laid-Open Patent Publication Nos. 59-51558, 60-235451, 60-235452 and 2-3957.

FIG. 23 is a circuit diagram for another conventional protection circuit 61 used in an integrated circuit 51 in which the potential of a substrate power supply is set to be different from the potential of the ground power supply, such as a DRAM (dynamic random access memory). FIG. 24 is a cross sectional view of the protection circuit 61.

As is shown in FIG. 23, the protection circuit 61 includes a resistance 13 between an input terminal 11 and an internal circuit 12. Point A between the resistance 13 and the internal circuit 12 is connected to a ground power supply through a MOS transistor 14. The internal circuit 12 is supplied with a power supply voltage $V_{CC}$ and a substrate power supply voltage $V_{BB}$ as well as a ground power supply voltage GND. The power supply voltage $V_{CC}$ is higher than the ground power supply voltage GND; and the substrate power supply voltage $V_{BB}$ is lower than the ground power supply voltage GND. As is shown in FIG. 24, a p-type semiconductor substrate 15 is not supplied with the ground power supply voltage GND, but is supplied with the substrate power supply voltage $V_{BB}$ through a p-type diffusion layer 16. Parasitic diodes 25, 29, 30 and 31 are respectively formed between the p-type semiconductor substrate 15 and an n-type diffusion layer 18, between the p-type semiconductor substrate 15 and an n-type diffusion layer 21, between the p-type semiconductor substrate 15 and an n-type diffusion layer 22, and between the p-type semiconductor substrate 15 and an n-type diffusion layer 28.

As an evaluation method of the resistance of such a semiconductor device against electrostatic discharge, the MIL standards (MIL-STD 883C 3015) are used as the most common international standards. According to the MIL standards, a capacitance of 100 pF is stored to have an appropriate voltage, and this voltage is applied to a terminal of the semiconductor device through a resistance of 1.5 kΩ. The voltage at which the semiconductor device is broken is measured.

The evaluation is performed for the protection circuit 61 in the following manner. The ground power supply voltage GND and the power supply voltage $V_{CC}$ are used as the reference voltages. In the following explanation, a voltage higher than the ground power supply voltage GND will be referred to as the voltage in the "GND+ mode", a voltage lower than the ground power supply voltage GND as the voltage in the "GND− mode", a voltage higher than the power supply voltage $V_{CC}$ as the voltage in the "$V_{CC}$+ mode", and a voltage lower than the power supply voltage $V_{CC}$ as the voltage in the "$V_{CC}$− mode".

<GND+ mode>

When a voltage in the GND+ mode is applied to the input terminal 11, as is shown in FIG. 25, the MOS transistor 14 conducts with a low resistance due to the punch-through phenomenon, and the electrostatic current flows from input terminal 11 to the ground power supply (GND) through the resistance 13 and the MOS transistor 14. Accordingly, the electrostatic current does not flow to the internal circuit 12, thereby protecting the internal circuit 12. <GND− mode>

In the protection circuit 60 shown in FIGS. 19 and 20, the parasitic diode 25 is connected to the ground power supply through an anode thereof. In contrast, in the protection circuit 61 shown in FIGS. 23 and 24, the parasitic diodes 25, 29, 30 and 31 are each connected to the substrate power supply through an anode thereof. Namely, the parasitic diode 25 is formed by the pn junction of the p-type semiconductor substrate 15 and the n-type diffusion layer 18 (namely, the resistance 13). The parasitic diode 29 is formed by the pn junction of the p-type semiconductor substrate 15 and the n-type diffusion layer 21 of the MOS transistor 14. The parasitic diode 30 is formed by the pn junction of the p-type semiconductor substrate 15 and the n-type diffusion layer 22 of the MOS transistor 14. The parasitic diode 31 is formed by the pn junction of the p-type semiconductor substrate 15 and the n-type diffusion layer 28. The p-type semiconductor substrate 15 acting as an anode of the parasitic diodes 25, 29, 30 and 31 is supplied with the substrate power supply voltage $V_{BB}$.

Accordingly, when a voltage in the GND− mode is applied to the input terminal 11, as is shown in FIG. 26, the parasitic diode 30 is supplied with a voltage higher than the breakdown voltage thereof. An electrostatic current flows from the ground power supply (GND) to the input terminal 11 through the parasitic diodes 30 and 25 and the resistance 13. In such a case, the MOS transistor 14 is not included in the path of the electrostatic current and therefore does not act as a protection device. Further, a large amount of electrostatic current flows in the reverse direction in the parasitic diode 30 although the current flows forward in the parasitic diode 25. Such a large amount of electrostatic current causes power dissipation at the junction interface of the parasitic diode 30. Where the breakdown voltage of the parasitic diode 30 is Ie, a power expressed by Ie×BVj locally increases the temperature of the junction interface. When the temperature exceeds 1415° C., which is a general melting point of silicon, the interface breaks down.

As is shown in FIGS. 26 and 27, point B at which the parasitic diode 30 is connected to the ground power supply includes a contact area between the wiring 17 formed of aluminum and the n-type diffusion layer 22. Since a power expressed by Ie$^2$× contact resistance is consumed at point B, increase in Ie accompanies rapid increase in power loss. When the temperature of the contact area is raised by the heat caused by power loss up to around 560° C., aluminum in the wiring 17 goes into the n-type diffusion layer 22, thereby generating a so-called Al penetration phenomenon. When the aluminum reaches the junction interface of the parasitic diode 30, namely, the interface of the p-type semiconductor substrate 15 and the n-type diffusion layer 23, the interface thereof is broken. For example, in the case wherein an electrostatic current flows in the direction shown by an arrow in FIG. 27, aluminum 32 goes into the n-type diffusion layer 22 in this direction and reaches the p-type semiconductor substrate 15, thereby breaking the interface. Thus, due to the different potentials of the substrate power supply and of the ground power supply, the junction interface of the parasitic diode 30 is broken by a relatively small amount of electrostatic current in the GND− mode.

<$V_{CC}$+ mode>

When a voltage in the $V_{CC}$+ mode is applied to the input terminal 11, as is shown in FIG. 28, the parasitic diodes 29 and 30 are each supplied with a voltage higher than the breakdown voltage thereof. Accordingly, an electrostatic current flows from the input terminal 2 to the power supply ($V_{CC}$) through the parasitic diode 29 or the MOS transistor 14 and the parasitic diode 30 and forward through the parasitic diode 31. As a result, in the $V_{CC}$+ mode, power dissipation is concentrated at the parasitic diode 29 or 30, thereby breaking the junction interface of the parasitic diode 29 or 30.

<$V_{CC}-$ mode>

When a voltage in the $V_{CC}-$ mode is applied to the input terminal 11, as is shown in FIG. 29, the parasitic diodes 30 and 31 are each supplied with a voltage higher than the breakdown voltage thereof. Accordingly, an electrostatic current flows from the power supply ($V_{CC}$) to the input terminal 11 through the parasitic diode 31 or a resistance 33 in the internal circuit 12 and the parasitic diode 30, and forward through the parasitic diode 25. As a result, in the $V_{CC}-$ mode, power dissipation is concentrated at the parasitic diode 30 or 31, thereby breaking the junction interface of the parasitic diode 30 or 31.

As described above, the conventional protection circuit involves the problem that the junction interface of the parasitic diodes is easily broken in the GND− mode as well as the $V_{CC}+$ mode and the $V_{CC}-$ mode. Such a problem has recently become especially serious because the diffusion layers are being manufactured to smaller thicknesses at the same time the diffusion concentration is increasing due to the higher integration in a semiconductor apparatus, which causes lower breakdown voltages of a parasitic diode.

SUMMARY OF THE INVENTION

According to the present invention, a semiconductor apparatus including a protection device against electrostatic discharge is provided. The semiconductor apparatus includes an internal circuit; a terminal connected to the internal circuit; a ground wiring for applying a ground voltage to the internal circuit; a substrate bias wiring for applying a substrate bias voltage to a substrate in which the semiconductor apparatus is provided; at least one power supply wiring for applying a voltage having a different polarity from the polarity of the substrate bias voltage in response to the ground voltage; a first protection device against electrostatic discharge for allowing a breakdown current to flow in response to a voltage having at least a specified level, the protection device being provided between the substrate bias wiring and the ground wiring; a plurality of second protection devices against electrostatic discharge for allowing a breakdown current to flow in response to a voltage having at least a specified level, the protection devices being respectively provided between the terminal and one of the ground wiring and the substrate bias wiring, and between the power supply wiring and one of the terminal, the ground wiring and the substrate bias wiring; and a plurality of diodes respectively provided between the substrate bias wiring and the power supply wiring, between the substrate bias wiring and the terminal, and between the substrate bias wiring and the ground wiring.

Thus, the invention described herein makes possible the advantage of providing a semiconductor apparatus for ensuring protection thereof against electrostatic discharge.

This and other advantages of the present invention will become apparent to those skilled in the art upon reading and understanding the following detailed description with reference to the accompanying figures.

BRIEF DESCRIPTION OF THE DRAWINGS

FIG. 23 is a circuit diagram for another conventional integrated circuit including a protection circuit.

FIG. 24 is a cross sectional view of the integrated circuit shown in FIG. 23.

DESCRIPTION OF THE PREFERRED EMBODIMENTS

Hereinafter, the present invention will be described by way of illustrative examples with reference to the accompanying drawings.

EXAMPLE 1

A semiconductor apparatus in a first example according to the present invention will be described with reference to FIGS. 1A, 1B and 2 to 7.

Figure 1A:
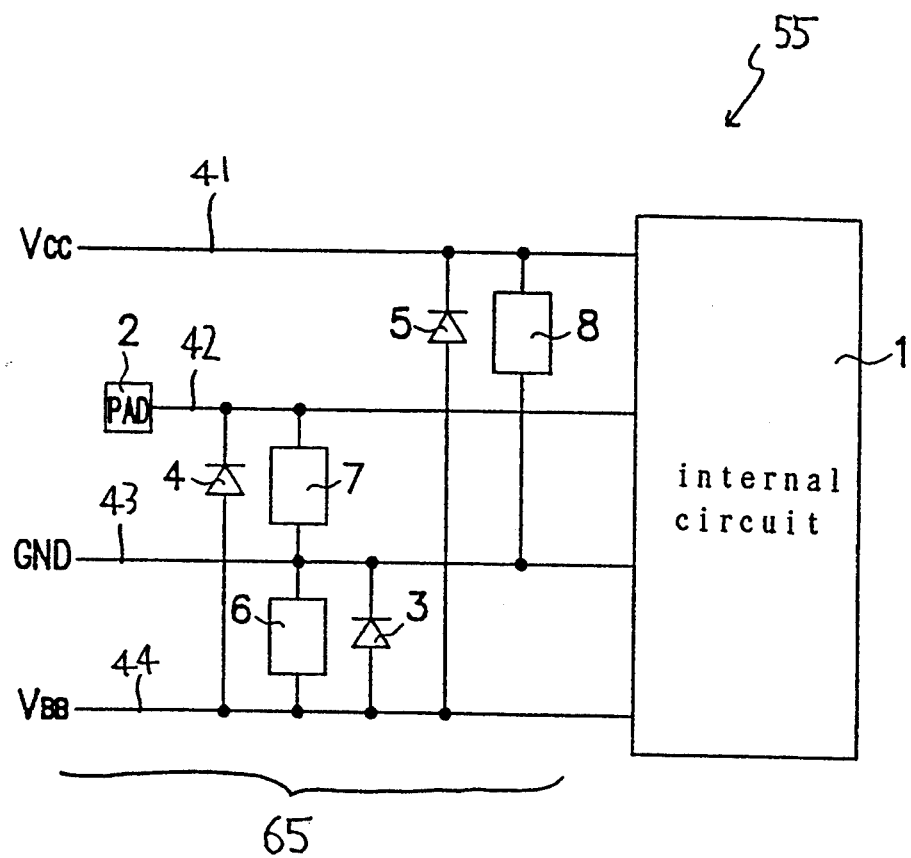
FIG. 1A is a circuit diagram for a semiconductor apparatus including a protection device in an example according to the present invention.
Figure 1B:
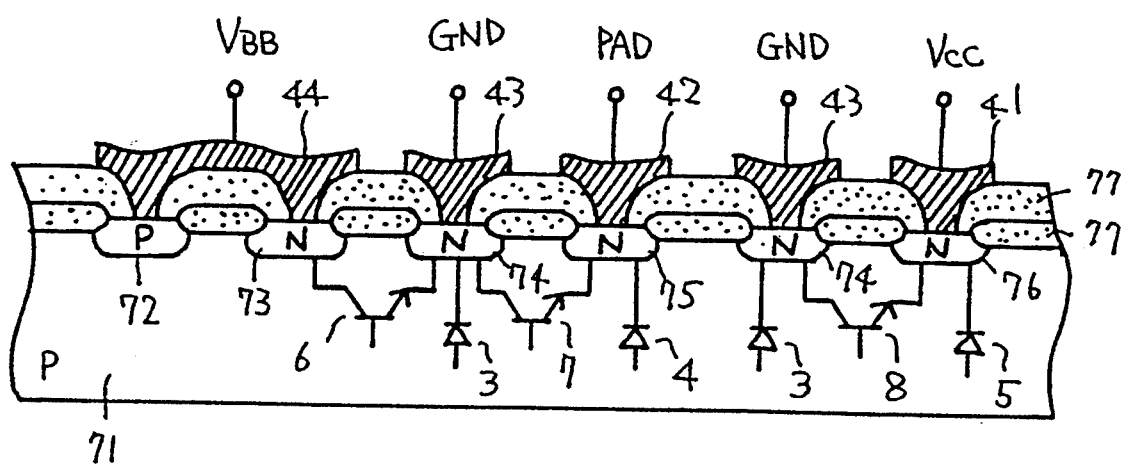
FIG. 1B is a partial cross sectional view of the semiconductor device shown in FIG. 1.

As is shown in FIG. 1A, a semiconductor apparatus 55 includes an internal circuit 1 and a protection circuit 65. The internal circuit 1 is connected to a power supply wiring 41 for applying a power supply voltage $V_{CC}$ to the internal circuit 1 and also to a signal wiring 42 connected to a terminal 2 for inputting a signal to the internal circuit 1. The terminal 2 may be an output terminal for outputting a signal from the internal circuit 1 or an I/O terminal acting both as an input terminal for inputting a signal to the internal circuit 1 and an output terminal for outputting a signal from the internal circuit 1. It is understood that the present invention can be applied both to an input terminal and to an output terminal. The internal circuit 1 is connected to ground through a ground wiring 43. The internal circuit 1 is mounted on a semiconductor substrate (not shown). As is shown in FIG. 1B, a substrate bias voltage $V_{BB}$ is applied to a p-type semiconductor substrate 71 through a substrate bias wiring 44, thereby applying the substrate bias voltage $V_{BB}$ to the internal circuit 1. It is also possible that a substrate bias voltage generating circuit for applying a substrate bias voltage $V_{BB}$ to the semiconductor substrate 71 is provided in the semiconductor apparatus 55.

Figure 19:
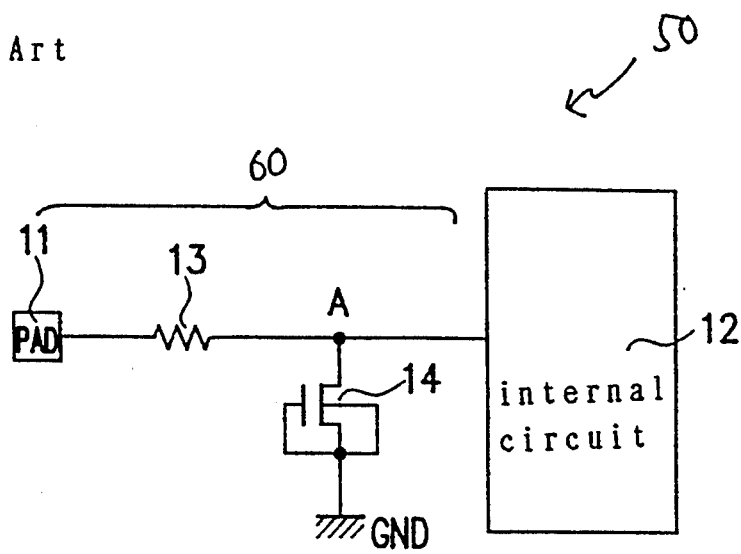
FIG. 19 is a circuit diagram for a conventional integrated circuit including a protection circuit.
Figure 20:
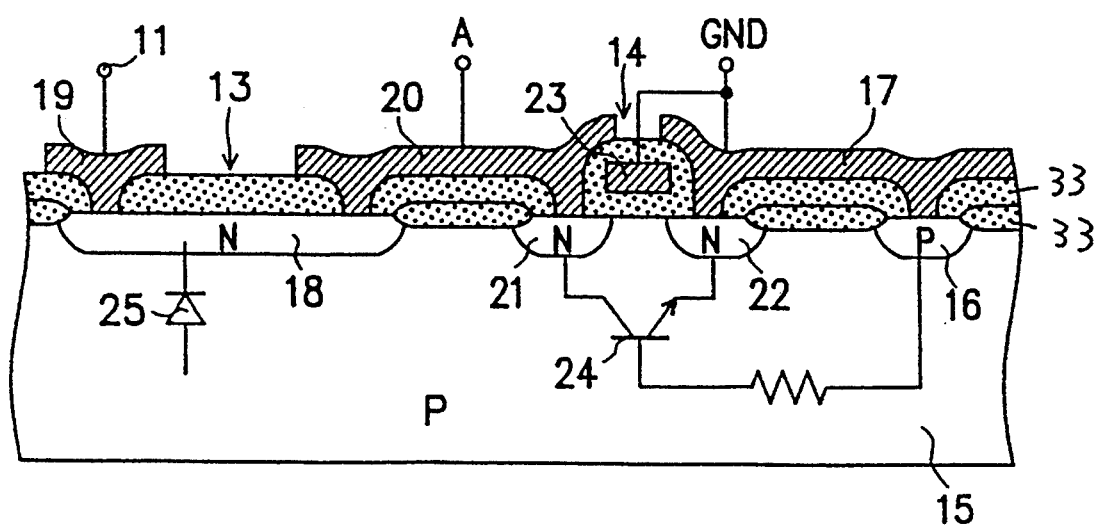
FIG. 20 is a cross sectional view of the integrated circuit shown in FIG. 19.
Figure 21:
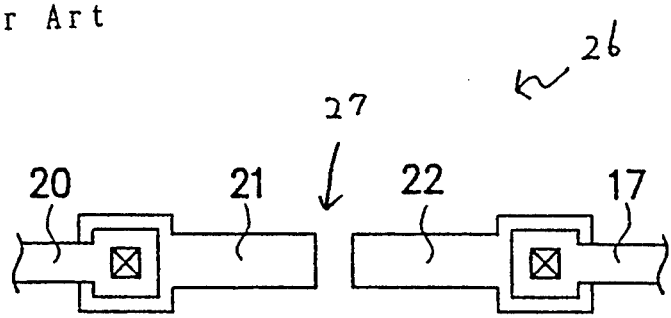
FIG. 21 is a view illustrating a construction for an npn transistor used as a protection device against electrostatic discharge.
Figure 22:
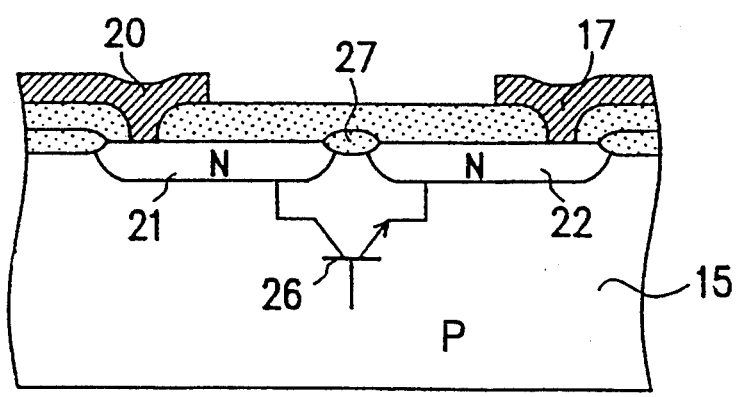
FIG. 22 is a cross sectional view of the npn transistor shown in FIG. 21.
Figure 2:
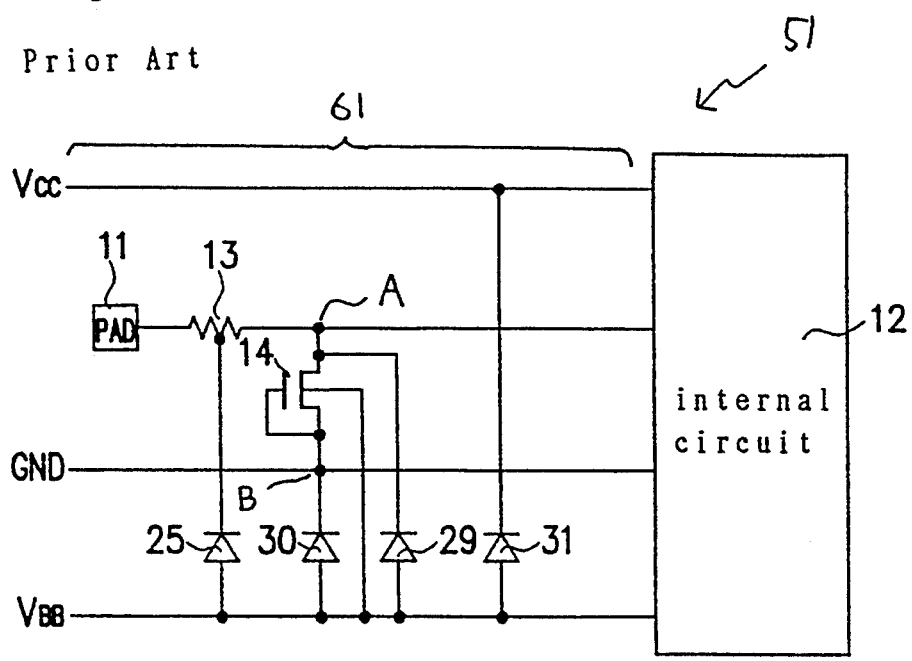
Figure 2:
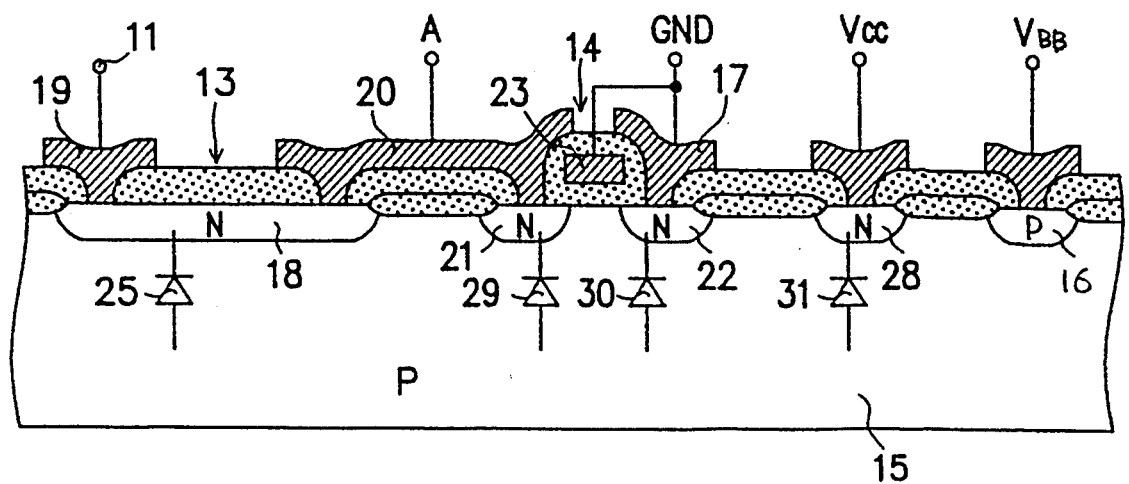
Figure 25:
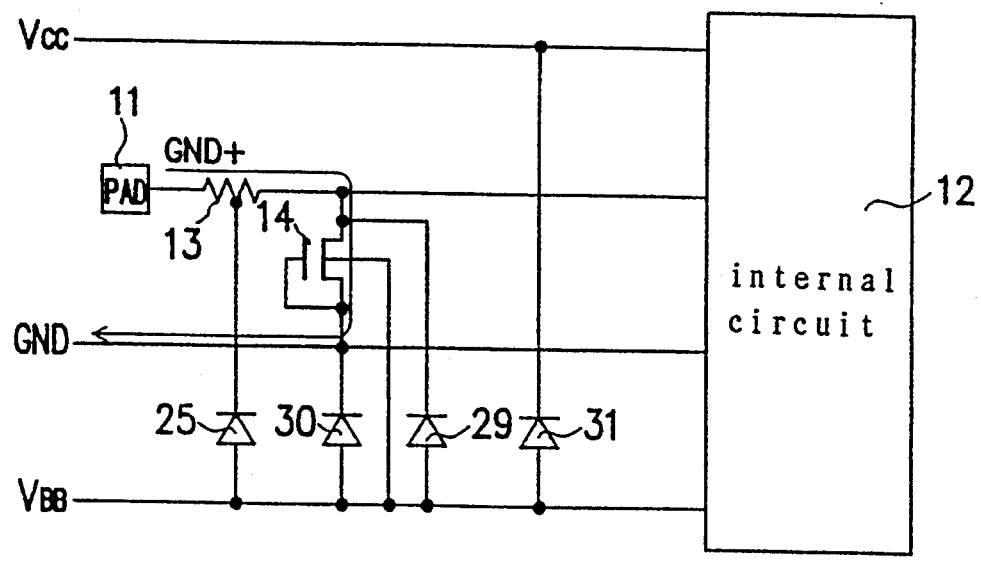
FIG. 25 is a circuit diagram illustrating an electrostatic current path in a GND+ mode in the conventional integrated circuit shown in FIG. 23.
Figure 26:
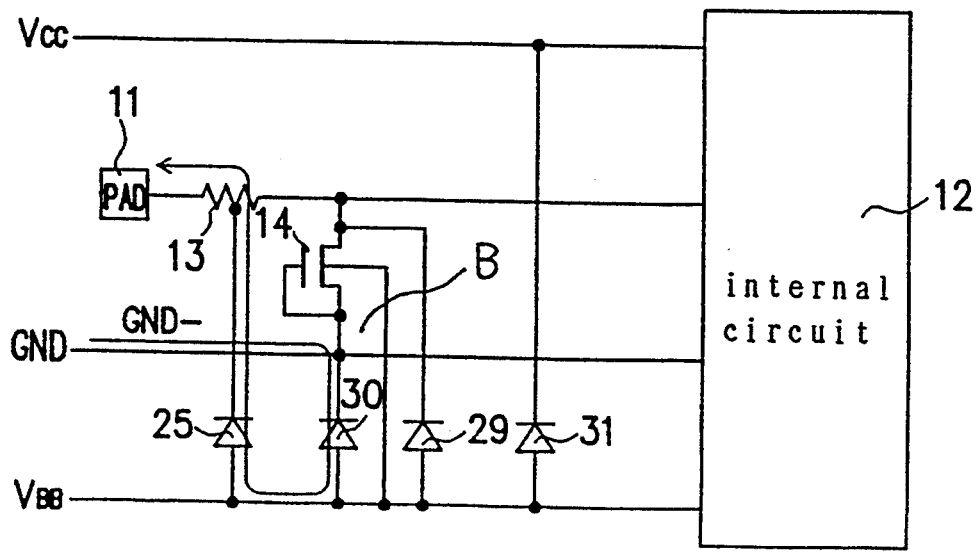
FIG. 26 is a circuit diagram illustrating an electrostatic current path in a GND− mode in the conventional integrated circuit shown in FIG. 23.
Figure 27:
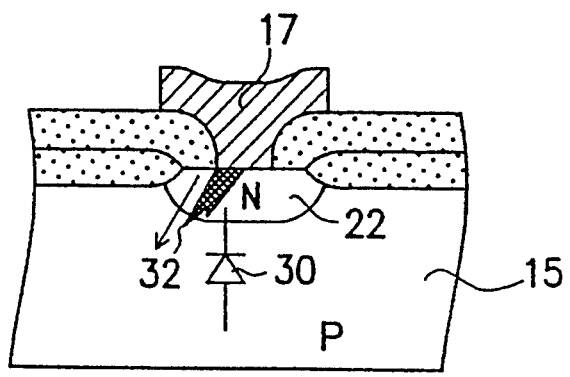
FIG. 27 is a cross sectional view of a semiconductor substrate of the conventional integrated circuit shown in FIG. 23 illustrating breakdown at an interface of a parasitic diode caused by electrostatic discharge.
Figure 28:
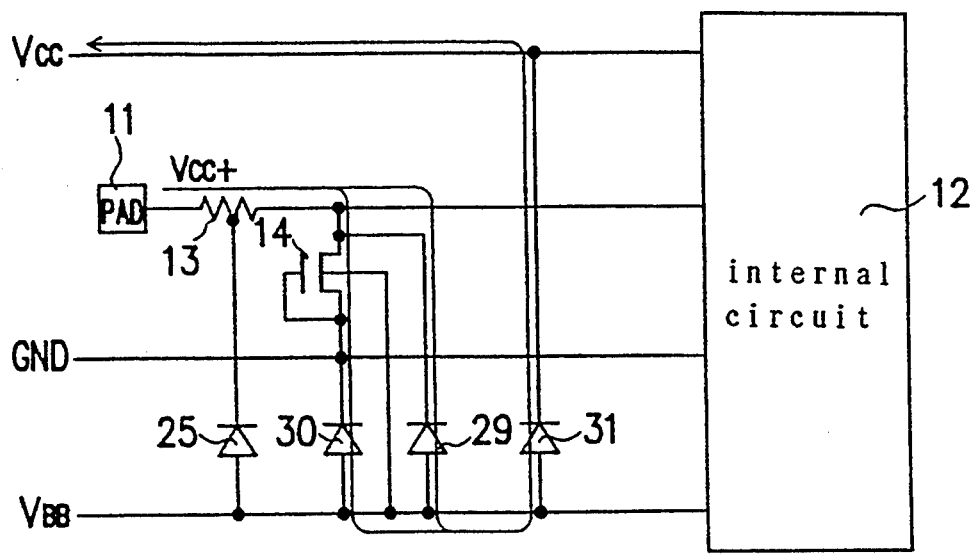
FIG. 28 is a circuit diagram illustrating an electrostatic current path in a $V_{CC}+$ mode in the conventional integrated circuit shown in FIG. 23.
Figure 29:
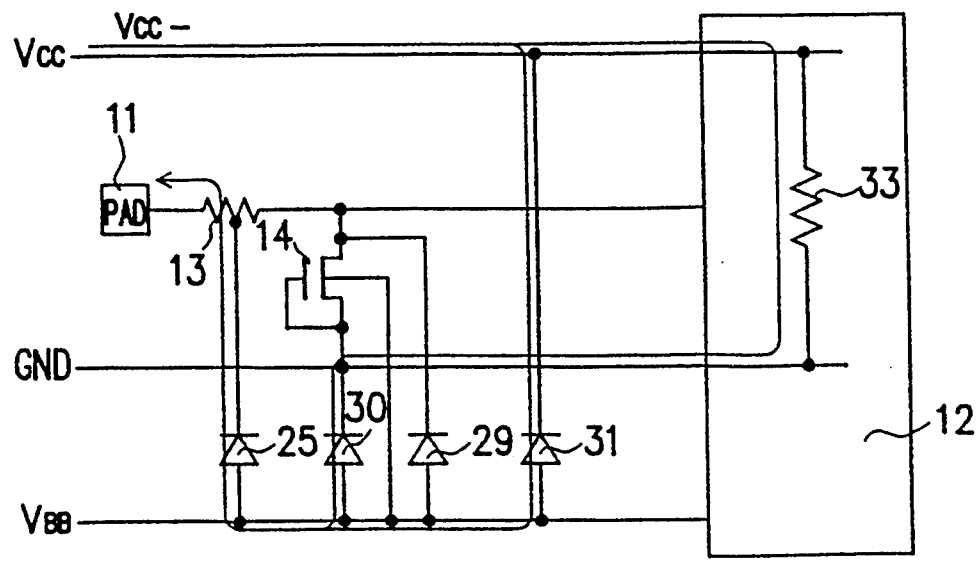
FIG. 29 is a circuit diagram illustrating an electrostatic current path in a $V_{CC}-$ mode in the conventional integrated circuit shown in FIG. 23.

A first protection device 6 contributing to protection of the semiconductor apparatus 55 against electrostatic discharge is connected between the substrate bias wiring 44 and the ground wiring 43. (Hereinafter, such a protection device against electrostatic discharge will be referred to simply as the "protection device".) A second protection device 7 is connected between the ground wiring 43 and the signal wiring 42. Another second protection device 8 is connected between the ground wiring 43 and the power supply wiring 41. The first protection device 6, and the second protection devices 7 and 8 may each be formed of a MOS transistor 14 shown in FIG. 19, an npn transistor 26 shown in FIG. 22, or any other type of device which allows a breakdown current to flow when a voltage having a specified level or higher is applied. In this example, the first and the second protection devices 6, 7 and 8 are each formed of an npn transistor.

A parasitic diode 3 is formed between the substrate bias wiring 44 and the ground wiring 43. A parasitic diode 4 is formed between the substrate bias wiring 44 and the signal wiring 42. A parasitic diode 5 is formed between the substrate bias wiring 44 and the power supply wiring 41. The parasitic diodes 3, 4 and 5 each have an anode on the side connected to the substrate bias wiring 44. The parasitic diodes 3, 4 and 5 are each formed of a pn junction of the semiconductor substrate 71 and an impurity diffusion region provided in the semiconductor substrate in order to protect the semiconductor apparatus 55 against electrostatic discharge.

Figure 2:
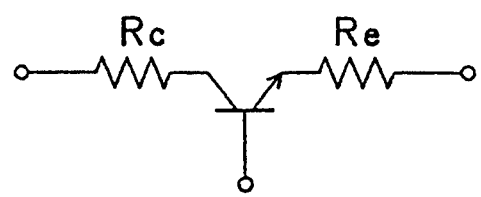
FIG. 2 is an equivalent circuit diagram for a protection device used in a semiconductor apparatus according to the present invention.
Figure 3:
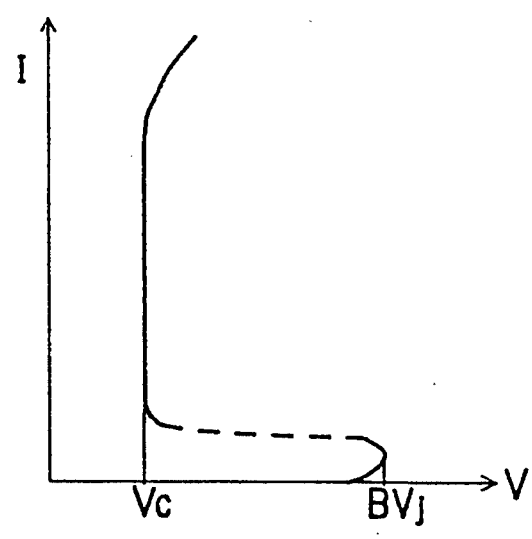
FIG. 3 is a graph illustrating a characteristic of the protection device shown in FIG. 2.

The npn transistor forming each protection device 6, 7 and 8 has an equivalent circuit shown in FIG. 2. The npn transistor has a snap-back characteristic as is shown in FIG. 3; that is when the voltage between the collector and the emitter reaches a breakdown voltage BVj thereof, the voltage falls down to clamp voltage $V_C$ to allow a large amount of breakdown current to flow. The clamp voltage is sufficiently lower than the breakdown voltage BVj. Resistances Rc and Re of the npn transistor, which represent resistance components of the n-type diffusion layers 21 and 22 shown in FIG. 22, respectively, restrict the amount of the breakdown current flowing due to the snap-back characteristic. The resistances Rc and Re are each set to have a value which does not allow the heat generated by the large amount of breakdown current to have a temperature exceeding the melting point of silicon. In the case where a large amount of breakdown current cannot be handled by one npn transistor, a plurality of npn transistors may be connected in parallel. In this example, since each npn transistor has a sufficient capacitance, the resistance 13 shown in the conventional example for restricting the amount of electrostatic current is eliminated.

With reference to FIG. 1B, the protection circuit 65 will be described in detail. The protection circuit 65 is formed in the p-type semiconductor 71. A surface area of the p-type semiconductor 71 includes a p-type impurity diffusion region 72 and n-type impurity diffusion regions 73, 74, 75 and 76. The substrate bias wiring 44 is formed on the p-type impurity diffusion region 72 and the n-type impurity diffusion region 73, and the substrate bias voltage $V_{BB}$ is applied to the p-type semiconductor substrate 71 through the substrate bias wiring 44 and the p-type impurity diffusion region 72. The ground wiring 43, the signal wiring 42 and the power supply wiring 41 are formed on the n-type impurity diffusion regions 74, 75 and 76. An insulation film 77 is formed in the semiconductor substrate 71 to prevent the wirings 41 to 44 from electrically contact one another.

The first protection device 6 includes the n-type impurity diffusion regions 73 and 74 and a part of the p-type semiconductor substrate 71. The second protection device 7 includes the n-type impurity diffusion regions 74 and 75 and a part of the p-type semiconductor substrate 71. The second protection device 8 includes the n-type impurity diffusion regions 74 and 76 and a part of the p-type semiconductor substrate 71. Since each of the n-type impurity diffusion regions 74 to 76 and the p-type semiconductor substrate 71 form a pn junction, parasitic diodes 3, 4 and 5 are formed in each pn junction. The structure of the protection circuit 65 shown in FIG. 1B is one example, and needless to say, other structures can be used for a protection circuit according to the present invention.

Hereinafter, an electrostatic current path in the semiconductor apparatus 55 will be described.

<GND+ mode>

Figure 4:
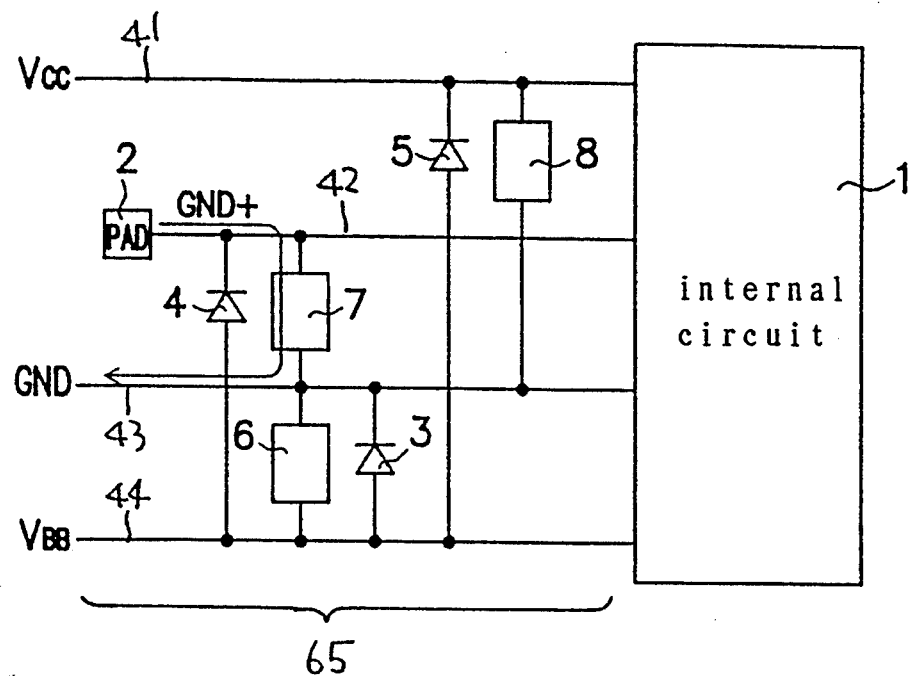
FIG. 4 is a circuit diagram illustrating an electrostatic current path in a GND+ mode in the semiconductor apparatus shown in FIG. 1.

When an electrostatic voltage in the GND+ mode is applied to the terminal 2, as is shown in FIG. 4, an electrostatic current flows from the terminal 2 to the ground (GND) through the signal wiring 42, the protection device 7 and the ground wiring 43. Since the voltage at each of the two ends of the parasitic diode 4 is clamped by the protection device 7, there is no power dissipation concentrated at any certain portion in the protection circuit 65 in the GND+ mode. Thus, protection of the internal circuit 1 is ensured.

<GND− mode>

Figure 5:
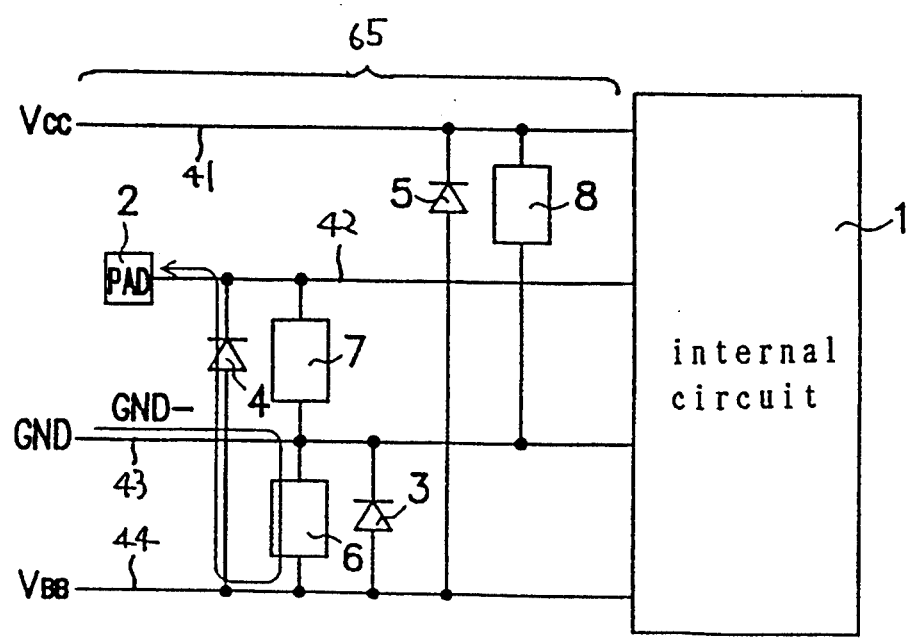
FIG. 5 is a circuit diagram illustrating an electrostatic current path in a GND− mode in the semiconductor apparatus shown in FIG. 1.

When an electrostatic voltage in the GND− mode is applied to the terminal 2, as is shown in FIG. 5, an electrostatic current flows from the ground (GND) to the substrate bias wiring 44 through the ground wiring 43 and the protection device 6. Thereafter, the electrostatic current flows forward through the parasitic diode 4 and then to the terminal 2. The protection device 6 clamps the voltage at each end of the parasitic diode 3 down to a level which is sufficiently lower than the breakdown voltage BVj in the GND− mode, thereby preventing the breakdown of the parasitic diode 3. Since no power dissipation is concentrated at any certain portion in the protection circuit 65, protection of the internal circuit 1 is ensured.

<$V_{CC}$+ mode>

Figure 6:
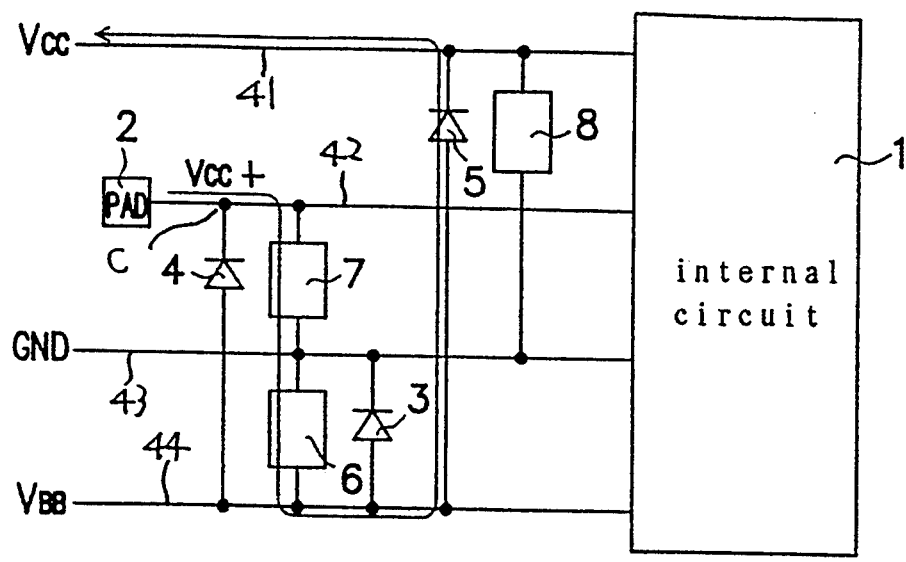
FIG. 6 is a circuit diagram illustrating an electrostatic current path in a $V_{CC}+$ mode in the semiconductor apparatus shown in FIG. 1.

When a voltage in the $V_{CC}$+ mode is applied to the terminal 2, as is shown in FIG. 6, an electrostatic current flows from the terminal 2 to the substrate bias wiring 44 through the protection devices 7 and 6. Thereafter, the electrostatic current flows forward through the parasitic diode 5 and then to the power supply wiring 41. Since no power dissipation is concentrated at any certain portion in the protection circuit 65 in the $V_{CC}$+ mode, protection of the internal circuit 1 is ensured. Further, since two protection devices 6 and 7 are inserted in series in the electrostatic current path, the resistance against electrostatic discharge is significantly higher compared to that in the conventional protection circuits. However, voltage at each end of the parasitic diode 4 is clamped to a level which is a sum of the clamp voltages at the protection devices 6 and 7. The resistance against electrostatic discharge at point C which is on the anode side of the parasitic diode 4 is lower compared with that in the GND+ mode and the GND− mode. Practically, the resistance against electrostatic discharge is slightly weakened between the n-type impurity diffusion region 75 connected to the terminal 3 and the semiconductor substrate 71.

<$V_{CC}$− mode>

Figure 7:
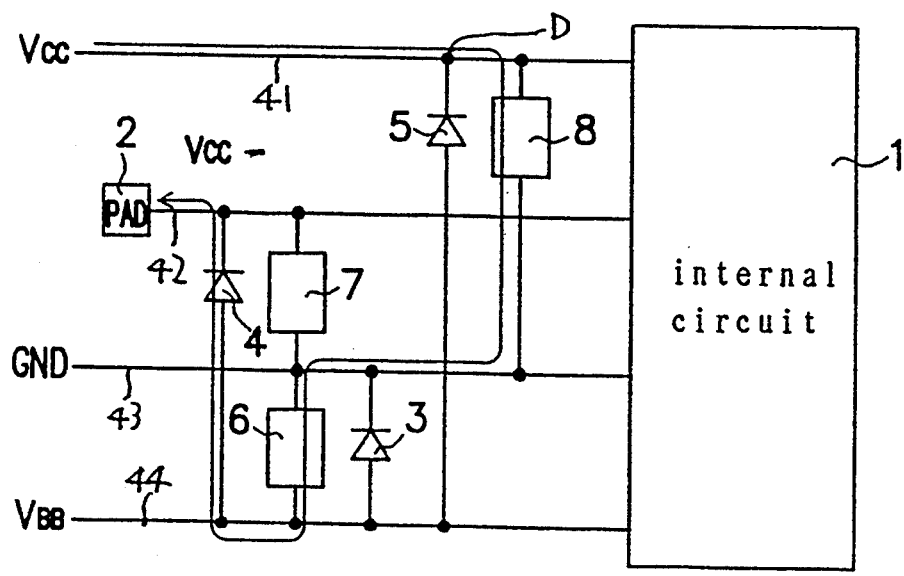
FIG. 7 is a circuit diagram illustrating an electrostatic current path in a $V_{CC}-$ mode in the semiconductor apparatus shown in FIG. 1.
Figure 8:
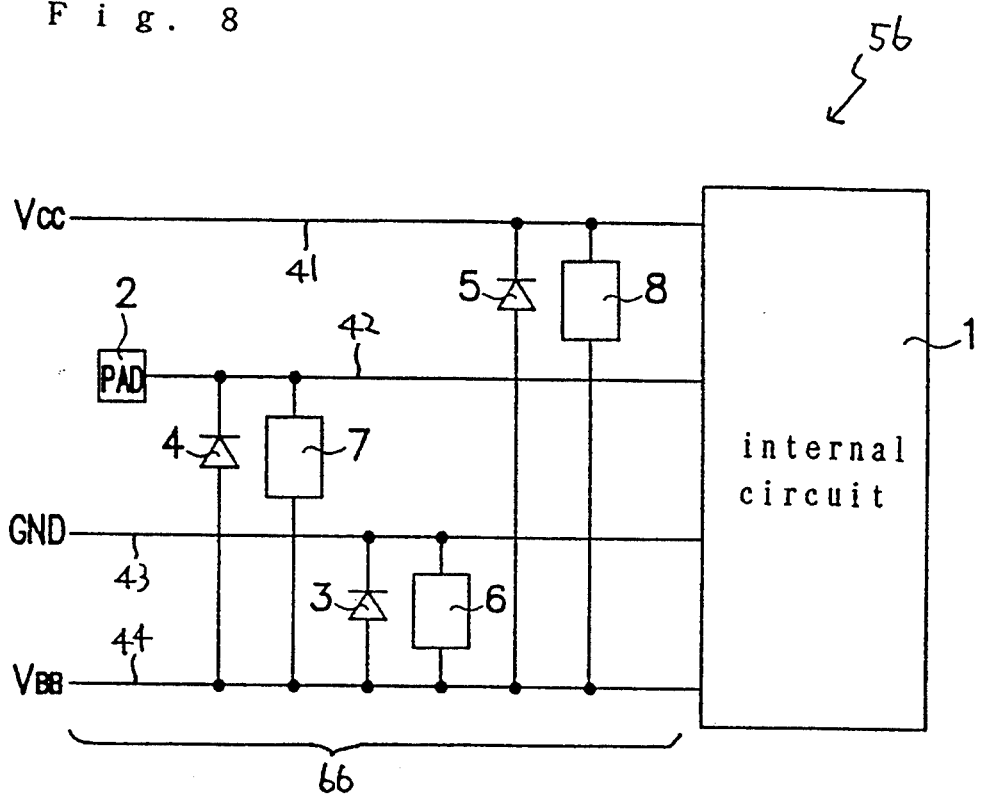
FIG. 8 is a circuit diagram for a semiconductor apparatus including a protection device in another example according to the present invention.

When a voltage in the $V_{CC}$− mode is applied to the terminal 2, as is shown in FIG. 7, an electrostatic current flows from the power supply ($V_{CC}$) to the substrate bias wiring 44 through the power supply wiring 41 and protection devices 8 and 6. Thereafter, the electrostatic current flows forward through the parasitic diode 4 and then to the terminal 2. Since no power dissipation is concentrated at any certain portion in the protection circuit 65 in the $V_{CC}$− mode, protection of the internal circuit 1 is ensured. Further, since two protection devices 8 and 6 are inserted in series in the electrostatic current path, the resistance against electrostatic discharge is significantly higher compared to that in the conventional protection circuits. However, voltage at each end of the parasitic diode 5 is clamped to a level which is a sum of the clamp voltages of the protection devices 8 and 6. The resistance against the electrostatic discharge at point D which is on the anode side of the parasitic diode 5 is lower compared with that in the GND+ mode and the GND− mode. Practically, the resistance against electrostatic discharge is slightly weakened between the impurity diffusion region 76 connected to the power supply wiring 41 and the semiconductor substrate 71.

EXAMPLE 2

With reference to FIGS. 8 to 12, a semiconductor apparatus in a second example according to the present invention will be described. Identical elements with those in the first example bear identical reference numerals therewith.

A semiconductor apparatus 56 includes an internal circuit 1 and a protection circuit 66. The internal circuit 1 is connected to a power supply wiring 41 for applying a power supply voltage $V_{CC}$ to the internal circuit 1 and also to a signal wiring 42 connected to a terminal 2 for inputting a signal to the internal circuit 1. The internal circuit 1 is connected to a ground through a ground wiring 43. The internal circuit 1 is mounted on a semiconductor substrate (not shown). A substrate bias voltage $V_{BB}$ is applied to the semiconductor substrate through a substrate bias wiring 44, thereby applying the substrate bias power supply $V_{BB}$ to the internal circuit 1. It is also possible that a substrate bias voltage $V_{BB}$ to the semiconductor substrate 71 is provided in the semiconductor apparatus 56.

A first protection device 6 is connected between the substrate bias wiring 44 and the ground wiring 43. A second protection device 7 is connected between the substrate bias wiring 44 and the signal wiring 42. Another second protection device 8 is connected between the substrate bias wiring 44 and the power supply wiring 41. The first protection device 6, and the second protection devices 7 and 8 may each be formed of a MOS transistor 14 shown in FIG. 19, an npn transistor 26 shown in FIG. 22, or any other type of device which allows a breakdown current to flow when a voltage having a specified level or higher is applied. In this example, the first and the second protection devices 6, 7 and 8 are each formed of an npn transistor.

A parasitic diode 3 is formed between the substrate bias wiring 44 and the ground wiring 43. A parasitic diode 4 is formed between the substrate bias wiring 44 and the signal wiring 42. A parasitic diode 5 is formed between the substrate bias wiring 44 and the power supply wiring 41. The parasitic diodes 3, 4 and 5 each have an anode on the side connected to the substrate bias wiring 44. The parasitic diodes 3, 4 and 5 are each formed of a pn junction of the semiconductor substrate and an impurity diffusion region provided in the semiconductor substrate in order to protect the semiconductor apparatus 55 against electrostatic discharge. The protection devices 6, 7 and 8 are provided in parallel with the parasitic diodes 3, 4 and 5, respectively.

Hereinafter, an electrostatic current path in the semiconductor apparatus 56 will be described.

<GND+ mode>

Figure 9:
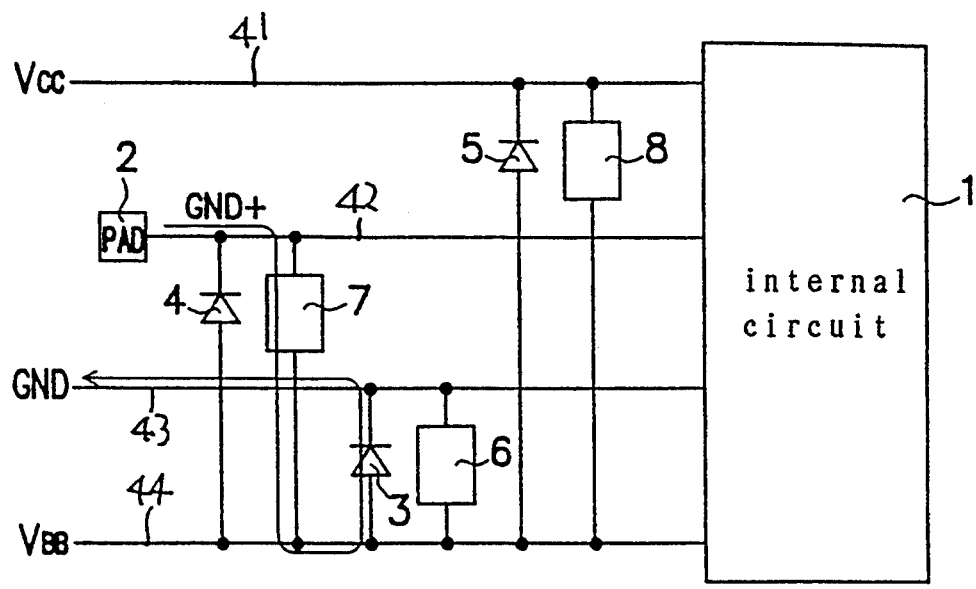
FIG. 9 is a circuit diagram illustrating an electrostatic current path in a GND+ mode in the semiconductor apparatus shown in FIG. 8.

When an electrostatic voltage in the GND+ mode is applied to the terminal 2, as is shown in FIG. 9, an electrostatic current flows from the terminal 2 to the substrate bias wiring 44 through the signal wiring 42 and the protection device 7. Thereafter, the electrostatic current flows forward through the parasitic diode 3 and then to the ground wiring 43. Since the protection device 7 clamps the voltage at each end of the parasitic diode 3 to a level which is sufficiently lower than that of the breakdown voltage BVj of the parasitic diode 3, the breakdown of the parasitic diode 3 does not occur. Since there is no power dissipation concentrated at any certain portion in the protection circuit 66 in the GND+ mode, protection of the internal circuit 1 is ensured. <GND— mode>

Figure 10:
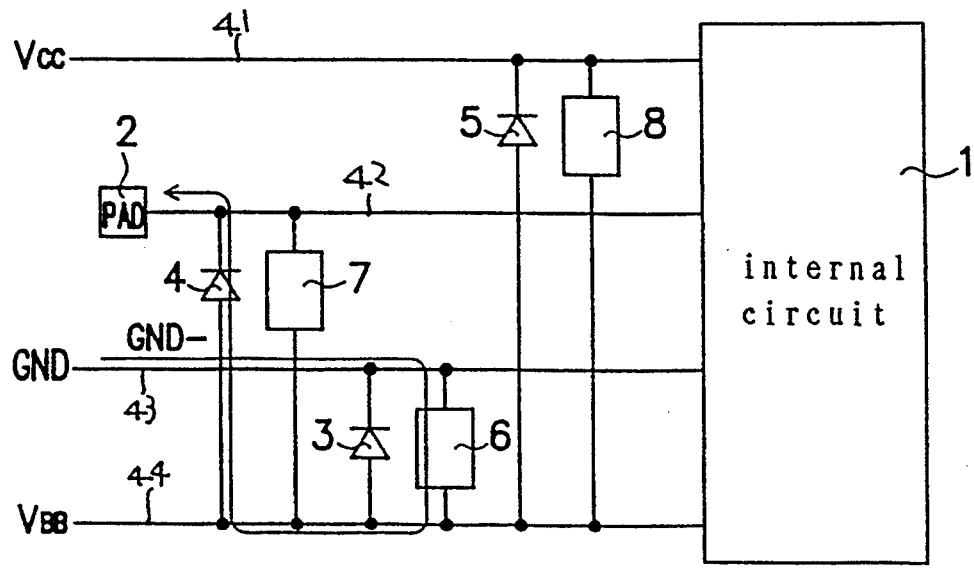
FIG. 10 is a circuit diagram illustrating an electrostatic current path in a GND− mode in the semiconductor apparatus shown in FIG. 8.

When an electrostatic voltage in the GND— mode is applied to the terminal 2, as is shown in FIG. 10, an electrostatic current flows from the ground power supply (GND) to the substrate bias wiring 44 through the ground wiring 43 and the protection device 6. Then, the electrostatic current flows forward through the parasitic diode 4 and then to the terminal 2. Since no power dissipation is concentrated at any certain portion in the protection circuit 66, protection of the internal circuit 1 is ensured.

<$V_{CC}+$ mode>

Figure 11:
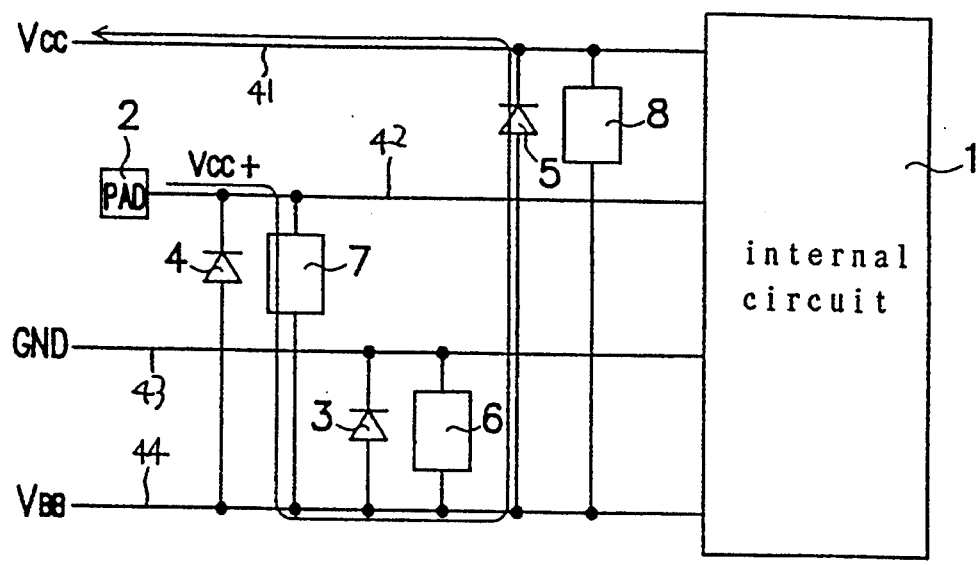
FIG. 11 is a circuit diagram illustrating an electrostatic current path in a $V_{CC}+$ mode in the semiconductor apparatus shown in FIG. 8.

When a voltage in the $V_{CC}+$ mode is applied to the terminal 2, as is shown in FIG. 11, an electrostatic current flows from the terminal 2 to the substrate bias wiring 44 through the signal wiring 42 and the protection device 7. Thereafter, the electrostatic current flows forward through the parasitic diode 5 and then to the power supply wiring 41. Since no power dissipation is concentrated at any certain portion in the protection circuit 66 in the $V_{CC}+$ mode, protection of the internal circuit 1 is ensured. Further, since only one protection device 7 is inserted in the electrostatic current path, only the voltage is obtained by clamping by the protection device 7 is applied at each end of the parasitic diode 4. Accordingly, the problem mentioned in the first example that the resistance against electrostatic discharge is lower compared with that in the GND+ mode and the GND— mode is solved.

Figure 12:
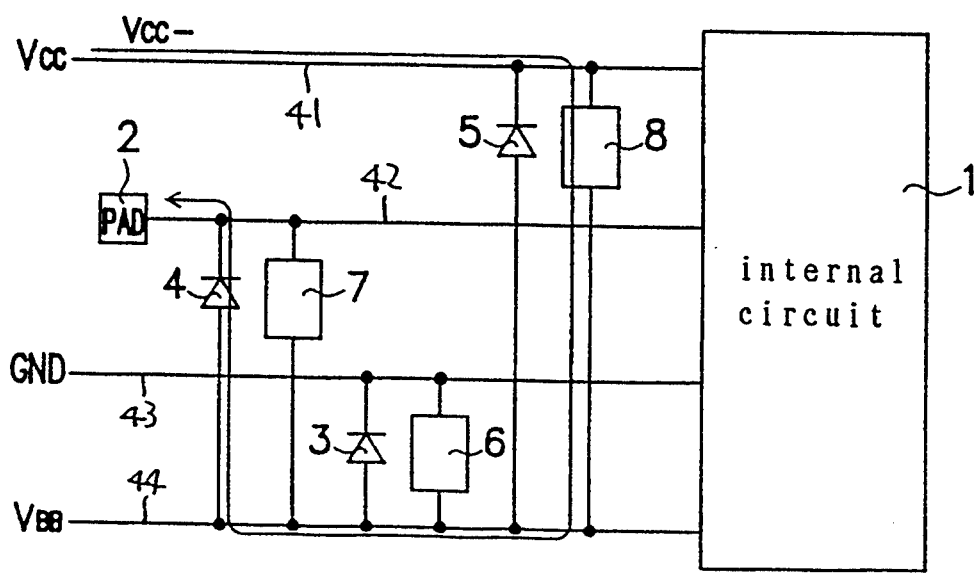
FIG. 12 is a circuit diagram illustrating an electrostatic current path in a $V_{CC}-$ mode in the semiconductor apparatus shown in FIG. 8.

When a voltage in the $V_{CC}-$ mode is applied to the terminal 2, as is shown in FIG. 12, an electrostatic current flows from the power supply ($V_{CC}$) to the substrate bias wiring 44 through the power supply wiring 41 and the protection device 8. Thereafter, the electrostatic current flows forward through the parasitic diode 4 and then to the signal wiring 42. Since no power dissipation is concentrated at any certain specific portion in the protection circuit 66 in the $V_{CC}-$ mode, protection of the internal circuit 1 is ensured. Further, since only one protection device 8 is inserted in the electrostatic current path, only the voltage obtained by clamping by the protection device 8 is applied at each end of the parasitic diode 5. Accordingly, the problem mentioned in the first example that the resistance against electrostatic discharge is lower compared with that in the GND+ mode and the GND— mode is solved.

Figure 13:
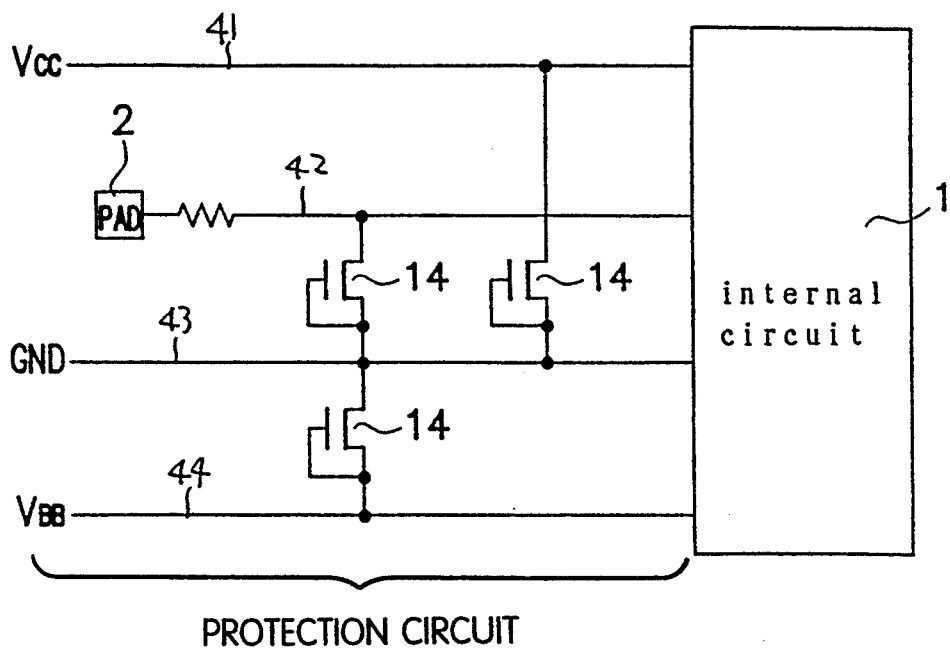
FIG. 13 is a circuit diagram for a semiconductor apparatus including a protection device in still another example according to the present invention.
Figure 14:
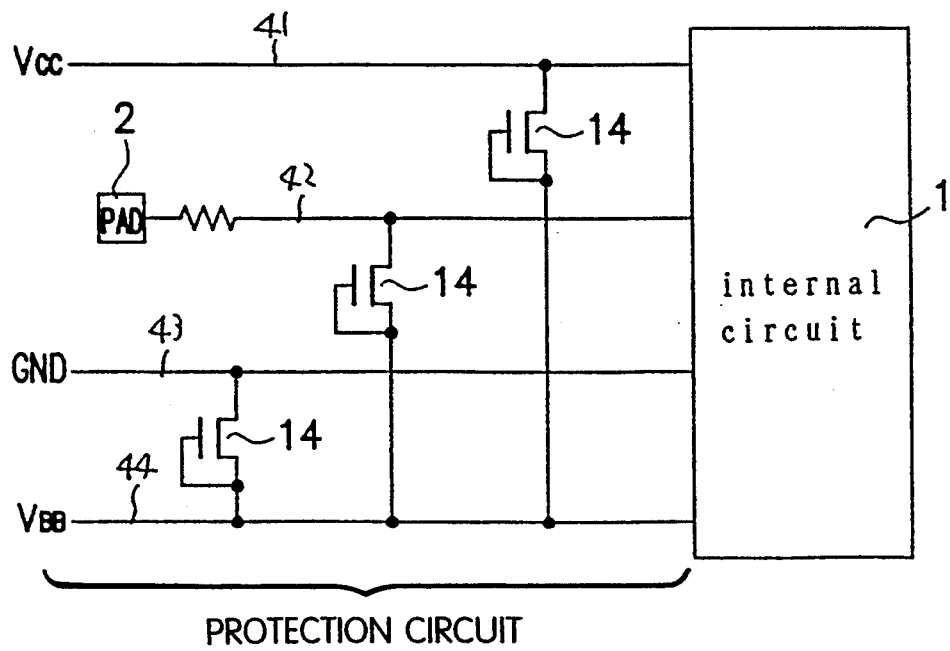
FIG. 14 is a circuit diagram for a semiconductor apparatus including a protection device in still another example according to the present invention.
Figure 15:
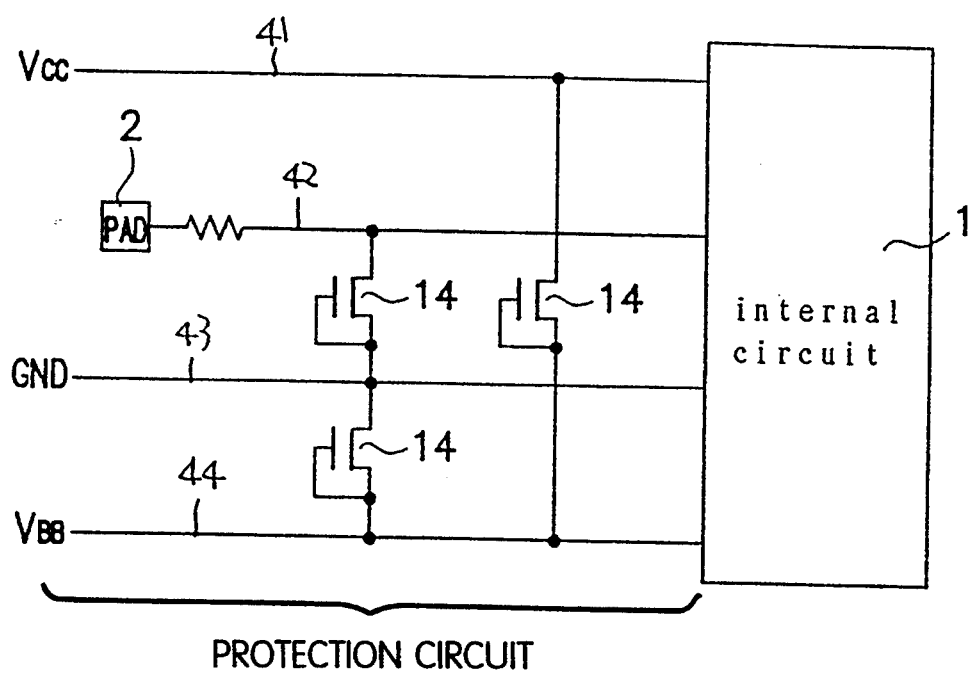
FIG. 15 is a circuit diagram for a semiconductor apparatus including a protection device in still another example according to the present invention.

FIG. 13 shows a semiconductor apparatus having an identical construction as that in the first example except that the protection devices 6 to 8 are each formed of a MOS transistor 14. FIG. 14 shows a semiconductor apparatus having an identical construction as that in the second example except that the protection devices 6 to 8 are each formed of a MOS transistor 14. The protection devices 6 to 8 formed of a MOS transistor 14 may be connected as is shown in FIG. 15.

Figure 16:
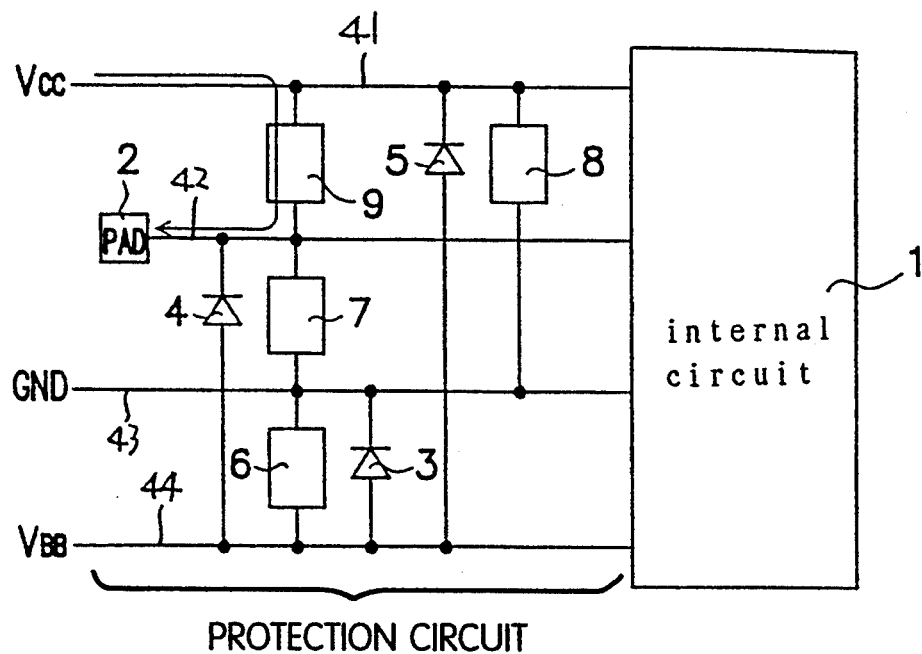
FIG. 16 is a circuit diagram for a semiconductor apparatus including a protection device in still another example according to the present invention.
Figure 17:
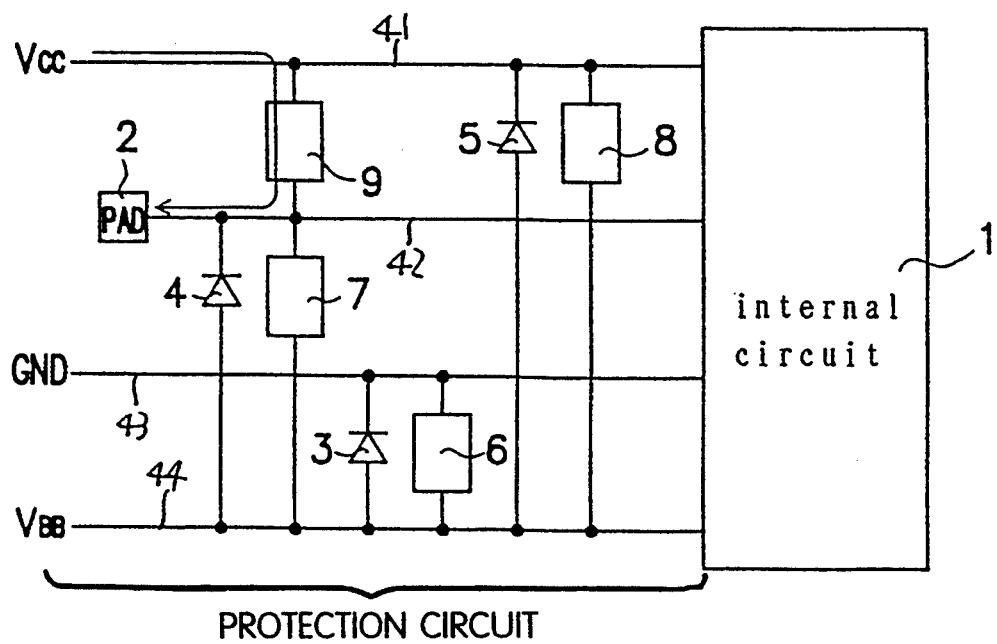
FIG. 17 is a circuit diagram for a semiconductor apparatus including a protection device in still another example according to the present invention.

FIG. 16 shows a modification of the semiconductor apparatus shown in the first example, where another second protection device 9 is provided between the power supply wiring 41 and the signal wiring 42. FIG. 17 shows a modification of the semiconductor apparatus shown in the second example, where another second protection device 9 is provided between the power supply wiring 41 and the signal wiring 42. In the semiconductor apparatus having such a construction, in the $V_{CC}-$ mode, the electrostatic current flows from the power supply ($V_{CC}$) directly to the signal wiring 42 through the protection device 9.

Figure 18:
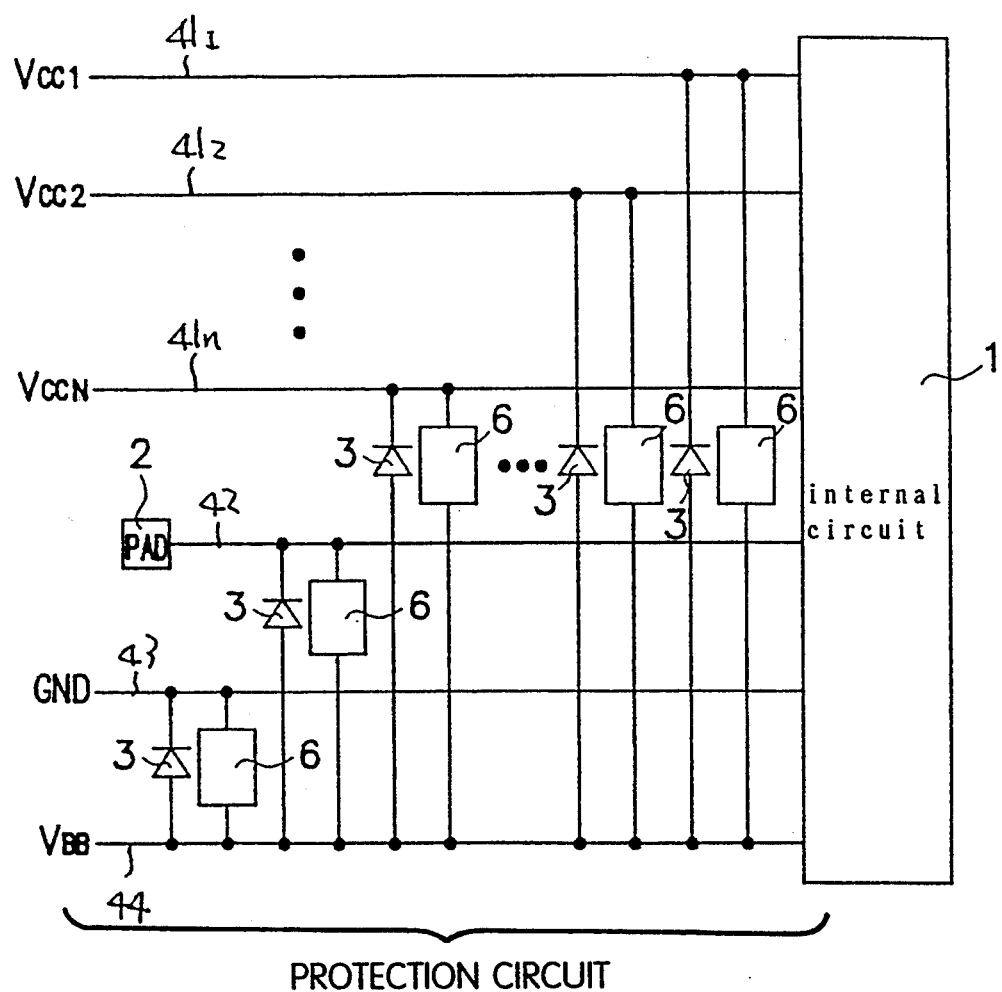
FIG. 18 is a circuit diagram for a semiconductor apparatus including a protection device in still another example according to the present invention.

In the first and the second examples, the internal circuit 1 is supplied with only one power supply voltage $V_{CC}$. As is shown in FIG. 18, the internal circuit 1 may be supplied with a plurality of power supply voltages $V_{CC1}$ to $V_{CCn}$. A plurality of protection devices 6 are respectively provided between the substrate bias wiring 44 and the ground wiring 43, between the substrate bias wiring 44 and the signal wiring 42, and between the substrate bias wiring 44 and each of the plurality of power supply wirings $41_1$ to $41_n$. By the pn junctions of the impurity diffusion region of each protection device 6 and the semiconductor substrate 71, a plurality of parasitic diodes 3 are respectively formed between the substrate bias wiring 44 and the ground wiring 43, between the substrate bias wiring 44 and the signal wiring 42, and between the substrate bias wiring 44 and each of the power supply wirings $41_1$ to $41_n$. The parasitic diodes 3 are each in parallel with the corresponding protection device 6.

As has been described above, the substrate bias wiring 44 and the ground wiring 43 are directly connected to each other through the first protection device 6. The substrate bias wiring 44 and each of the power supply wirings $41_1$ to $41_n$, and the substrate bias wiring 44 and the terminal 2 are directly connected to each other through the second protection device, or connected through the ground power supply and a first and a second protection devices. In a semiconductor apparatus having such a construction, parasitic diodes are respectively formed by a pn junction between each power supply wiring 41 and the substrate bias wiring 44, between the signal wiring 42 and the substrate bias wiring 44, and between the ground wiring 43 and the substrate bias wiring 44. When an excessive electrostatic voltage is applied between the terminal 2 and each power supply wiring 41 or between the terminal 2 and the ground wiring 43, in the case wherein the terminal 2 has a higher potential than that of the power supply voltage $V_{CC}$ or the ground power supply voltage GND, an electrostatic current flows from the terminal 2 directly to the substrate bias wiring 44 through the protection device, or an electrostatic current flows from the terminal 2 to the substrate bias wiring 44 through the ground wiring 43 and two protection devices. After reaching the substrate bias wiring 44, the electrostatic current flows forward through a parasitic diode and to the power supply wiring 41 or the ground wiring 43. In the case wherein the terminal has a lower potential than that of the power supply voltage $V_{CC}$ or the ground power supply voltage GND, an electrostatic current flows from the power supply wiring 41 or the ground wiring 43 directly to the substrate bias wiring 44 through the protection device, or an electrostatic current flows from the power supply wiring 41 to the substrate bias wiring 44 through the ground wiring 43 and two protection devices. After reaching the substrate bias wiring 4, the electrostatic current flows forward through a parasitic diode and then to the terminal 2.

In a semiconductor apparatus according to the present invention, an electrostatic current flows through one or two protection devices and flows forward through a parasitic diode, whichever polarity the electrostatic voltage applied to each power supply wiring 41 or the ground wiring 43 has. As a result, breakdown of the interface of the parasitic diode which is conventionally caused by application of a high reverse voltage to the parasitic diode or the like can be avoided. As a result, the resistance against electrostatic discharge can significantly be improved both in an integrated circuit only having a ground power supply and in an integrated circuit having a substrate bias power supply and a ground power supply.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor apparatus including a protection circuit against electrostatic discharge, comprising:
   an internal circuit;
   a terminal connected to the internal circuit;
   a ground wiring for applying a ground voltage to the internal circuit;
   a substrate bias wiring for applying a substrate bias voltage to a substrate in which the semiconductor apparatus is provided;
   at least one power supply wiring for applying a voltage having a different polarity from the polarity of the substrate bias voltage relative to the ground voltage;
   a first protection device against electrostatic discharge for allowing a breakdown current to flow in response to a voltage having at least a specified level, the protection device being connected between the substrate bias wiring and the ground wiring;
   a plurality of second protection devices against electrostatic discharge for allowing a breakdown current to flow in response to a voltage having at least a specified level, the protection devices being respectively provided between the terminal and one of the ground wiring and the substrate bias wiring, and between the power supply wiring and one of the terminal, the ground wiring and the substrate bias wiring; and
   a plurality of diodes respectively provided between the substrate bias wiring and the power supply wiring, between the substrate bias wiring and the terminal, and between the substrate bias wiring and the ground wiring, wherein the first and the plurality of second static electricity protection devices are each formed of a bipolar transistor.

2. A semiconductor apparatus including a protection circuit against electrostatic discharge, comprising:
   an internal circuit;
   a terminal connected to the internal circuit;
   a ground wiring for applying a ground voltage to the internal circuit;
   a substrate bias wiring for applying a substrate bias voltage to a substrate in which the semiconductor apparatus is provided;
   at least one power supply wiring for applying a voltage having a different polarity from the polarity of the substrate bias voltage relative to the ground voltage;
   a first protection device against electrostatic discharge for allowing a breakdown current to flow in response to a voltage having at least a specified level, the protection device being connected between the substrate bias wiring and the ground wiring;
   a plurality of second protection devices against electrostatic discharge for allowing a breakdown current to flow in response to a voltage having at least a specified level, the protection devices being respectively provided between the terminal and one of the ground wiring and the substrate bias wiring, and between the power supply wiring and one of the terminal, the ground wiring and the substrate bias wiring; and
   a plurality of diodes respectively provided between the substrate bias wiring and the power supply wiring, between the substrate bias wiring and the terminal, and between the substrate bias wiring and the ground wiring, wherein the first and the plurality of second protection devices are each formed of a MOS transistor.

3. A semiconductor apparatus for protecting an internal circuit from electrostatic discharge, the semiconductor device comprising:
   a semiconductor substrate having a first conductivity (P);
   at least one impurity diffusion region having the first conductivity provided in the semiconductor substrate;
   a plurality of impurity diffusion regions each having a second conductivity provided in the semiconductor substrate;
   a substrate bias wiring for electrically connecting the impurity diffusion region having the first conductivity and at least one of the plurality of impurity diffusion regions having the second conductivity, thereby applying a substrate bias potential to the semiconductor substrate;
   a ground wiring electrically connected to at least one of the plurality of impurity diffusion regions having the second conductivity, thereby applying a ground potential to the internal circuit;
   a terminal electrically connected to at least one of the plurality of impurity diffusion regions having the second conductivity, thereby connecting the impurity diffusion region electrically connected thereto to the internal circuit; and
   at least one power supply wiring electrically connected to at least one of the plurality of impurity diffusion regions having the second conductivity, thereby applying a power supply potential to the internal circuit, wherein
   the impurity diffusion region having the second conductivity electrically connected to the substrate bias wiring, the impurity diffusion region having the second conductivity electrically connected to the ground wiring, and a part of the semiconductor substrate form a first protection device against electrostatic discharge,
   the impurity diffusion region having the second conductivity electrically connected to the terminal, the impurity diffusion region having the second conductivity electrically connected to the ground wiring, and a part of the semiconductor substrate form a second protection device against electrostatic discharge, the impurity diffusion region having the second conductivity electrically connected to the power supply wiring, the impurity diffusion region having the second conductivity electrically connected to the ground wiring, and a part of the semiconductor substrate form a third protection device against electrostatic discharge, and the impurity diffusion region electrically connected to the ground wiring and the semiconductor substrate form a diode, the impurity diffusion region electrically connected to the terminal and the semiconductor substrate form another diode, and the impurity diffusion region electrically connected to the power supply wiring and the semiconductor substrate form still another diode.

* * * * *